(12) United States Patent
Stone

(10) Patent No.: US 9,762,235 B2
(45) Date of Patent: Sep. 12, 2017

(54) TOUCH-SENSITIVE INPUT DEVICE

(71) Applicant: Novalia Ltd, Cambridge (GB)

(72) Inventor: Kate Stone, Cambridge (GB)

(73) Assignee: Novalia Ltd, Cambridge (GB)

( * ) Notice: Subject to any disclaimer, the term of this patent is extended or adjusted under 35 U.S.C. 154(b) by 213 days.

(21) Appl. No.: 14/382,520

(22) PCT Filed: Mar. 1, 2013

(86) PCT No.: PCT/GB2013/050523
§ 371 (c)(1),
(2) Date: Sep. 2, 2014

(87) PCT Pub. No.: WO2013/128209
PCT Pub. Date: Sep. 6, 2013

(65) Prior Publication Data
US 2015/0021153 A1    Jan. 22, 2015

(30) Foreign Application Priority Data
Mar. 2, 2012  (GB) .................................. 1203730.5

(51) Int. Cl.
*H01H 13/70*  (2006.01)
*H01H 25/00*  (2006.01)
(Continued)

(52) U.S. Cl.
CPC ......... *H03K 17/9622* (2013.01); *G06F 3/044* (2013.01); *H03K 2017/9613* (2013.01);
(Continued)

(58) Field of Classification Search
CPC ..................... H01H 1/00; H01H 13/70; H01H 13/702–13/704; H01H 2239/074;
(Continued)

(56) References Cited

U.S. PATENT DOCUMENTS

| | | | |
|---|---|---|---|
| 4,855,550 A * | 8/1989 | Schultz, Jr. | ............. F24C 7/082 200/600 |
| 5,844,175 A * | 12/1998 | Nakanishi | ............... G06F 3/045 178/18.01 |

(Continued)

FOREIGN PATENT DOCUMENTS

| | | |
|---|---|---|
| CN | 102063232 A | 5/2011 |
| DE | 202011052063 U1 | 12/2011 |

(Continued)

OTHER PUBLICATIONS

Pending U.S. Appl. No. 14/382,515, filed Sep. 2, 2014.
(Continued)

*Primary Examiner* — Anthony R. Jimenez
(74) *Attorney, Agent, or Firm* — McCarter & English, LLP; David R. Burns

(57) ABSTRACT

A touch-sensitive input device (2) is described. The device comprises an opaque substrate (11) having first and second opposite faces (12, 13), a first set of electrodes (14) disposed on the first face of the substrate, the electrodes generally extending in a first direction and spaced apart along a second, transverse direction, and a second set of electrodes (17) disposed on the first or second face of the substrate, the electrodes generally extending in the second direction and spaced apart along the first direction, wherein the first and second sets of electrodes overlap.

21 Claims, 9 Drawing Sheets

(51) Int. Cl.
*H01H 25/04* (2006.01)
*H03K 17/96* (2006.01)
*G06F 3/044* (2006.01)

(52) U.S. Cl.
CPC ............ *H03K 2217/960755* (2013.01); *Y10T 29/49105* (2015.01); *Y10T 29/53204* (2015.01)

(58) Field of Classification Search
CPC ......... H01H 2203/008; H01H 2207/01; H01H 2221/00; H01H 2231/002; H01H 2231/012; H01H 2231/016; H01H 2231/052; H01H 2239/006; H03K 17/9622; H03K 2017/9613; H03K 2017/960755; G06F 3/044; Y10T 29/49105; Y10T 29/53204
USPC .................. 345/173; 200/600, 181, 19.06
See application file for complete search history.

(56) References Cited

U.S. PATENT DOCUMENTS

| | | | |
|---|---|---|---|
| 6,188,391 B1 | 2/2001 | Seely et al. | |
| 6,814,452 B2* | 11/2004 | Kusuda | G02F 1/133 359/609 |
| 7,437,820 B2* | 10/2008 | Sexton | B41J 2/085 216/27 |
| 7,864,160 B2* | 1/2011 | Geaghan | G06F 3/044 345/173 |
| 7,920,129 B2* | 4/2011 | Hotelling | G06F 3/0416 178/18.01 |
| 8,022,935 B2* | 9/2011 | Hotelling | G06F 3/044 345/156 |
| 8,421,755 B2* | 4/2013 | Seelhammer | G06F 3/0412 345/173 |
| 8,451,249 B2* | 5/2013 | Burns | G06F 3/0412 178/18.05 |
| 8,912,086 B2* | 12/2014 | Jo | G02F 1/13439 174/389 |
| 9,128,568 B2* | 9/2015 | Long | B32B 17/10036 |
| 9,304,630 B2* | 4/2016 | Feng | G06F 3/044 |
| 2002/0094660 A1* | 7/2002 | Getz | G06F 3/041 438/455 |
| 2004/0012570 A1* | 1/2004 | Cross | G06F 3/045 345/173 |
| 2007/0037559 A1* | 2/2007 | Kaiserman | G06Q 30/02 455/414.2 |
| 2007/0176608 A1* | 8/2007 | Mackey | G01D 5/2415 324/660 |
| 2007/0224412 A1* | 9/2007 | Hara | B32B 17/06 428/336 |
| 2008/0142352 A1* | 6/2008 | Wright | G06F 3/044 200/600 |
| 2009/0002323 A1* | 1/2009 | Shiroishi | G06F 3/044 345/173 |
| 2009/0002337 A1 | 1/2009 | Chang | |
| 2010/0044122 A1* | 2/2010 | Sleeman | G01D 5/2405 178/18.06 |
| 2010/0177055 A1* | 7/2010 | Ookawara | G06F 3/047 345/173 |
| 2010/0267307 A1* | 10/2010 | Park | B23K 26/206 445/25 |
| 2011/0007011 A1 | 1/2011 | Mozdzyn | |
| 2011/0012865 A1* | 1/2011 | Nozawa | G06F 3/045 345/174 |
| 2011/0057900 A1 | 3/2011 | Huang et al. | |
| 2011/0063240 A1 | 3/2011 | Tanabe | |
| 2011/0128246 A1* | 6/2011 | Esaka | G06F 3/044 345/173 |
| 2011/0148785 A1* | 6/2011 | Oda | G06F 3/03545 345/173 |
| 2011/0227840 A1* | 9/2011 | Sim | G06F 3/044 345/173 |
| 2011/0267307 A1* | 11/2011 | Kim | G02F 1/13338 345/174 |
| 2011/0272260 A1 | 11/2011 | Wallace et al. | |
| 2011/0279410 A1 | 11/2011 | Han et al. | |
| 2012/0013544 A1 | 1/2012 | Philipp | |
| 2012/0235927 A1* | 9/2012 | Ho | G06F 3/044 345/173 |
| 2013/0221991 A1* | 8/2013 | Campbell | G01R 27/2605 324/658 |

FOREIGN PATENT DOCUMENTS

| | | |
|---|---|---|
| JP | 60065325 | 4/1985 |
| JP | 2003280807 A | 10/2003 |
| JP | 2011018194 A | 1/2011 |
| WO | 2009/108765 A2 | 9/2009 |
| WO | 2009/108765 A3 | 11/2009 |
| WO | 2010/102491 A1 | 9/2010 |
| WO | 2011/023856 A1 | 3/2011 |
| WO | 2011/062301 A1 | 5/2011 |
| WO | 2013023489 A1 | 2/2013 |

OTHER PUBLICATIONS

Day S, Low Cost Touch Sensor on the Underside of a Casing, Synaptics, Inc., 2004.
GB Search Report GB1203730.5 dated Jul. 2, 2012.
GB Search Report GB1203730.5 dated May 6, 2014.
Unander T, et al., Printed touch sensor for interactive packaging and display, IEEE Polytronic Conference, 2007, pp. 12-17.
English Translation of First Office Action for Chinese Patent Application No. 201380019324.3 by State Intellectual Property Office of the People's Republic of China dated Jul. 6, 2016.
Examination Report issued in Great Britain Application No. GB1203730.5 dated Mar. 9, 2016. 2 pages.
Examination Report issued in Great Britain Application No. GB1203729.7 dated Mar. 9, 2016. 2 pages.
Examination Report issued in Great Britain Application No. GB1413075.1 dated Mar. 9, 2016. 2 pages.
GB Search Report GB1203729.7 dated Jul. 2, 2012.

* cited by examiner

TOUCH-SENSITIVE INPUT DEVICE

RELATED APPLICATIONS

This application is a 35 U.S.C. §371 national stage application of International Application No. PCT/GB2013/050523, filed Mar. 1, 2013, which claims the benefit of United Kingdom Patent Application No. 1203730.5, filed Mar. 2, 2012. The entire contents of each of the foregoing applications are explicitly incorporated herein by reference.

FIELD OF THE INVENTION

The present invention relates to a touch-sensitive input device, such as a capacitive pointing device or capacitive touch switch.

BACKGROUND

Touch-sensitive input devices, such as track pads, are being increasingly employed in user interfaces in a wide variety of electronic consumer products, such as phones, music players, tablet computers and cameras, as well as household appliances, electronic office equipment, automobiles and industrial machinery.

SUMMARY

The present invention seeks to provide a touch-sensitive input device which is cheap and easy to fabricate.

According to a first aspect of the present invention there is provided a touch-sensitive input device comprising an opaque substrate having first and second opposite faces, a first set of electrodes disposed on the first face of the substrate, the electrodes generally extending in a first direction and spaced apart along a second, transverse direction, and a second set of electrodes disposed on the first or second face of the substrate, the electrodes generally extending in the second direction and spaced apart along the first direction, wherein the first and second sets of electrodes overlap.

Thus, the device can be fabricated using relatively inexpensive conductive materials, such as carbon- and/or silver-based conductive ink, using relatively a simple and cheap process, such as flexographic printing, and using cheap substrates, such as paper or card.

The second set of electrodes may be disposed on the second face of the substrate such that the substrate is interposed between the first and second set of electrodes. Thus, the substrate can be used as an insulating layer and so tolerances for aligning the first and second sets of electrodes can be relaxed.

The device may comprise a set of insulating pads. The second set of electrodes may be disposed on the first face of the substrate and the insulating pads insulate the first set of electrodes from the second set of electrodes. At least some portions of the first set of electrodes and portions of the second set of electrodes may be formed as separate regions in a first layer and other portions of the second set of electrodes, for example thin conductive line(s), may be formed in a second layer which connects the portions of the second set of electrodes. Thus, critical regions of the first and second sets of electrodes can be formed at the same time in the same layer which can help form a self-aligned structure of electrodes. The first layer may comprise a first conductive material, such as carbon-based conductive ink, and the second layer may comprise a second different conductive material, such as silver-based conductive ink.

The at least some portions of the first set of electrodes and the portions of the second set of electrodes may include a reversed out image of the other portions of the second set of electrodes. This can help to reduce intermixing of different inks.

According to a second aspect of the present invention there is provided a touch-sensitive input device comprising a first substrate having first and second opposite faces, a first set of opaque electrodes disposed on the first face of the first substrate, the electrodes generally extending in a first direction and spaced apart along a second, transverse direction, a second substrate having first and second opposite faces, wherein the first and second substrates overlie and a second set of electrodes disposed on the first of the second substrate, the electrodes generally extending in the second direction and spaced apart along the first direction. The first and second sets of electrodes overlap and the first and/or second substrate is (are) opaque. The first and second substrates may be same This can help facilitate fabrication since the two sets of electrodes can be formed separately on different substrates or different parts of the same substrate and the two electrode-bearing substrates can later be aligned and joined together. In the case where the two sets of electrodes are formed on different parts of the same substrate, this can be achieved by folding.

In the first set of electrodes, width of an electrode between outermost edges of the electrode may periodically increase and decrease along the electrode so as to form wide sections and narrow sections of the electrode and the electrodes may be arranged so as to form narrow and wide spaces between adjacent electrodes. In the the second set of electrodes, width of an electrode between outermost edges of the electrode may periodically increase and decrease along the electrode so as to form wide sections and narrow sections of the electrode. Wide sections of an electrode in the second set of electrodes may be disposed in wide spaces between adjacent electrodes in the first set of electrodes.

The wide sections may be lozenge shaped. This can help to determine the relative position of a finger between two adjacent rows (or columns) of electrodes.

The wide section of an electrode in the first set of electrodes may have a maximum width of between 5 mm and 20 mm. The narrow section of an electrode in the first set of electrodes may have a minimum width of between 1 mm and 5 mm. The wide space between adjacent electrodes in the first set of electrodes may have a maximum width of between 5 mm and 20 mm.

Each electrode may have a length of at least 100 mm.

The device may further comprise at least one conductive track, each conductive track running from or close to an edge of the substrate and being directly connected to a respective electrode, the conductive track a higher sheet resistance than the electrode.

The electrodes in first set of electrodes may be opaque. The electrodes in second set of electrodes may be opaque.

An electrode may comprise a layer of conductor-based conductive ink. The conductive ink may be water-based. The conductive ink may be solvent-based. The conductive ink may be curable, for example using ultraviolet (UV) light. The conductor comprises a metal-based conductive ink, such as silver- or copper-based conductive ink, or a carbon-based conductive ink. A semiconductor polymer is preferably not used.

An electrode may comprise a metallic foil, which may be formed by hot- or cold-foil stamping, or by (selectively) de-metalizing a metallised substrate.

An electrode may have a thickness of at least 1 µm, at least 2 µm, at least 5 µm, at least 8 µm, at least 10 µm, at least 12 µm or at least 15 µm. The layer of opaque conductive material may have a thickness of no more than 100 µm or no more than 50 µm, no more than 20 µm or no more than 10 µm. Dry conductive ink, for example applied by flexography, may have a thickness of between 1 and 10 µm.

The substrate may be flexible. The substrate may comprise a flexible substrate. The substrate may comprise paper, card or cardboard. The paper or card may comprise formable paper or card. The substrate may be shaped (or "moulded"). For example, the substrate may be embossed. The faces of the substrate need not be flat, but can be contoured. The substrate may comprise a plastic material. For example, the substrate may comprise polyethylene terephthalate (PET), polypropylene (PP) or polyethylene naphthalate (PEN). The substrate may comprise a laminate, for example comprising a layer of fibre-based material covered by a layer of plastic or sandwiched between two layers of plastic. By using a fibre-based material, less material can be used which can be environmentally friendly. The fibre-based material may comprise recycled material. The substrate may be rigid. The substrate may be rigid and/or may comprise silica glass. The substrate may be transparent or translucent.

The substrate may have a thickness of at least 30 µm, at least 50 µm or at least 80 µm. The substrate may have a thickness no more than 350 µm, no more than 200 µm or no more than 100 µm.

According to a third aspect of the present invention there is provided a touch-sensitive input device comprising a substrate formed of fibre-based material and at least one touch pad comprising conductive material provided on the substrate, wherein the substrate is moulded.

Thus, two sets of electrodes need not be used. For example, a set of touch buttons can be used.

The electrodes may be coated with an insulating layer.

The electrodes are preferably deposited in a single step, for example without a subsequent electroplating step.

According to a fourth aspect of the present invention there is provided and article comprising a touch-sensitive input device and the article supports printed indicia comprising non-conductive material.

The article may be a consumer product. The article may be a control device, such as a remote control, a mouse, a flat or shaped track pad or the like.

The indicia may be printed on the substrate or on another substrate, such as a plastic coating or fibre-based cover, overlying the substrate.

According to a fifth aspect of the present invention there is provided apparatus comprising the touch-sensitive input device, a controller and at least one output device (such as a display, light emitting diodes and/or a speaker). The controller is configured to cause the output device to output a signal (e.g. light, sound etc) in response to user operation of the touch-sensitive input device.

According to a sixth aspect of the present invention there is provided a method of fabricating a touch-sensitive input device, the method comprising forming a first set of electrodes on a first face of a substrate, the first set of electrodes generally extending in a first direction and spaced apart along a second, transverse direction, and forming a second set of electrodes on the first face of the substrate or on a second, opposite face of the substrate, the second set of electrodes generally extending in the second direction and spaced apart along the first direction, wherein the first and second sets of electrodes overlap.

Forming the second set of electrodes may comprise forming the second set of electrodes on the second face of the substrate, such that the substrate is interposed between the first and second set of electrodes.

The method may further comprise forming a set of insulating pads. The second set of electrodes is disposed on the first face of the substrate and the insulating pads insulate the first set of electrodes from the second set of electrodes.

Forming the first set of electrodes and forming the second set of electrode may comprise forming at least some portions of the first set of electrodes and portions of the second set of electrodes as separate regions in a first layer and forming other portions of the second set of electrodes in a second layer which connect the portions of the second set of electrodes.

Forming the at least some portions of the first set of electrodes and the portions of the second set of electrodes may comprises printing the first layer, for example, by flexographic printing. Forming the other portions of the second set of electrodes may comprise printing the second layer, for example by flexographic printing. Forming the insulating pads may comprise printing the pads, for example, by flexographic printing.

Forming the set of insulating pads may occur after forming the at least some portions of the first set of electrodes and the portions of the second set of electrodes and before forming the other portions of the second set of electrodes.

Forming the first set of electrodes may comprise printing a layer of the conductive material on the substrate. Forming the first set of electrodes may comprise forming or patterning a foil layer on the substrate. Forming the foil layer may comprise applying a patterned foil layer to the substrate. Forming the foil layer may comprise etching a continuous foil layer to form a patterned layer.

According to a seventh aspect of the present invention there is provided a method of fabricating a touch-sensitive input device, the method comprising forming a first set of electrodes on a first face of a first substrate, the first set of electrodes generally extending in a first direction and spaced apart along a second, transverse direction, forming a second set of electrodes on a first face of a second substrate, the second set of electrodes generally extending in the second direction and spaced apart along the first direction, overlapping the substrates such that the first and second sets of electrodes overlap.

The method may comprise forming first and second sets of electrodes on the same face of the same substrate, i.e. the first and second substrates are the same. The method may comprise folding the substrate so that the first and second sets of electrodes overlap. The method may comprise inserting an insulating sheet between the first and second sets of electrodes. The insulating sheet may comprise a portion of the substrate which is free of conductive material. The method may comprise coating the electrodes with an insulating layer.

According to an eighth aspect of the present invention there is provided apparatus for fabricating a touch-sensitive input device, the apparatus comprising means for providing an opaque sheet, means for forming a first set of electrodes on a first face of a sheet, the first set of electrodes generally extending in a first direction and spaced apart along a second, transverse direction, and means for forming a second set of electrodes on the first face of the substrate or on a second, opposite face of the substrate, the second set of electrodes generally extending in the second direction and spaced apart along the first direction, wherein the first and second sets of electrodes overlap.

Thus, a moving continuous sheet process, high-speed single-sheet process or other high-volume/high-speed process may be used.

The sheet providing means may include a roll configured to pay out the sheet or a single sheet feeder.

The means for forming the first set of electrodes may comprise first printer, for example a flexographic printer. The means for forming the second set of electrodes may comprise the first printer. In other words, the same printer can be used to form at least some portions of the second set of electrodes.

The means for forming the second set of electrodes comprises a second, different printer, for example a flexographic printer. The second printer may print on an opposite side of the sheet.

The apparatus may further comprise means for cutting the sheet to form separate substrates, such as rotary die cutter or a laser.

BRIEF DESCRIPTION OF THE DRAWINGS

Certain embodiments of the present invention will now be described, by way of example, with reference to the accompanying drawings in which.

DETAILED DESCRIPTION OF CERTAIN EMBODIMENTS

Figure 1:
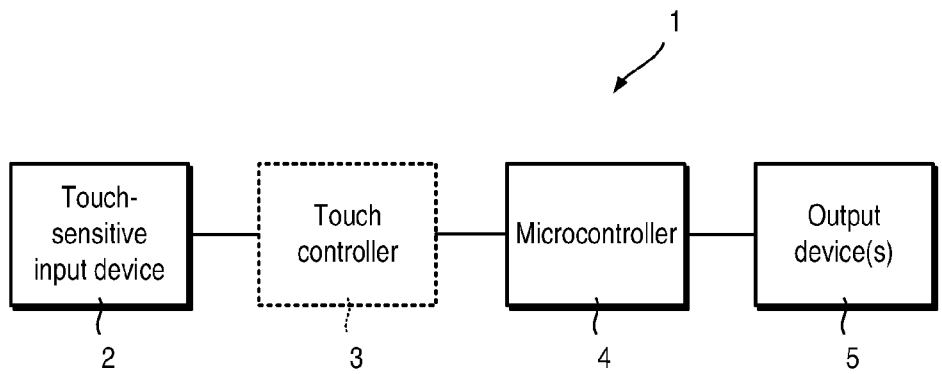
FIG. 1 is a block diagram of a device which includes a touch-sensitive input device in accordance with the present invention.

Referring to FIG. 1, an electronic device 1 is shown.

The device 1 may take the form of a control device, such as a (television) remote control, mouse or track-ball replacement device, or a user interface or control device for a larger device or appliance such as a phone, game, toy, music player, camera, household appliance, item of electronic office equipment, automobile or industrial machinery.

The device 1 includes an opaque touch-sensitive input device 2 in the form of a capacitive touch panel, an optional (dedicated) touch controller 3, a microcontroller 4 and output devices 5 such as USB interface, a liquid crystal display (LCD), projector, light emitting diodes and/or a speaker. The microcontroller may take the form of Texas Instruments™ MSP430™ bit microcontroller. However, other microcontrollers can be used. Moreover, the device 1 may comprise a computer system comprising a plurality of integrated circuits (not shown) providing one or more processors, memory and input/output interfaces interconnected by a bus system. Components and peripheral devices, such as capacitors and resistors, are not shown in FIG. 1. Other optional input devices, such as an image sensor (for a camera) or a microphone, are not shown in FIG. 1.

The touch-sensitive input device 2 may be mounted to another substrate, such as a poster or greeting card.

The touch-sensitive input device 2 is capable of detecting x-y position on the panel.

Referring to FIGS. 2 to 8, the touch-sensitive input device 2 comprises an opaque electrically-insulating substrate 11 having first and second opposite sides 12, 13 (herein also referred to as "faces"). The substrate has a thickness, $t_s$, of about 30 μm to about 1 mm or more. The substrate 11 is flexible and is formed from paper, card or cardboard which has a relative permittivity, $\epsilon_r$. The substrate may be formed from formable paper or card, such as Billerud FibreForm®. The substrate 11 may comprise a laminate comprising a layer of fibre-based material, such as paper or card, and one or two layers of plastic. In some examples, the substrate 11 can be rigid. In certain examples, the substrate 11 may be transparent or translucent.

A first set of electrodes 14 and first set of conductive tracks 15 are formed directly on the first side 12 of the substrate 11. The first set of electrodes 14 and the first set of tracks 15 comprise different regions of a layer 16 of an opaque, silver-based conductive ink having a thickness, $t_1$, of about 10 μm.

A second set of electrodes 17 and a second set of conductive tracks 18 are formed directly on the second side 13 of the substrate 11. The second set of electrodes 17 and second set of tracks 18 comprise different regions of a layer 19 of the opaque, silver-based conductive ink having a thickness, $t_2$, of about 10 μm.

The substrate 11 is disposed between the first and second sets of electrodes 14, 17 and electrically insulates the first set of electrodes 14 from the second set of electrodes 17.

A silver-based conductive ink is used and is deposited by printing.

The conductive ink is a water-based conductive ink and may be applied by flexographic printing. However, other forms of ink, such as a solvent-based conductive ink, can be used and other printing processes, such as ink jet printing, may be employed. Other types of conductive inks can be used, such as copper- or carbon-based conductive inks. The same or different conductive inks can be used for the first and second layers 16, 19. The same or different thicknesses of conductive ink can be used for the first and second layers 16, 19.

A water-based conductive ink may have an application viscosity between 90 to 300 centipoise (cP). A UV-cured conductive ink may have an application viscosity of about 250 to 600 cP. A solvent-based conductive ink may have an application viscosity of 100 to 500 cP.

A water- or solvent-based conductive ink may have a solid content of 15 to 80% solids by volume and/or up to 95% by weight. A UV-cured conductive ink may be considered effectively to be 100% by volume or weight.

Figure 4:
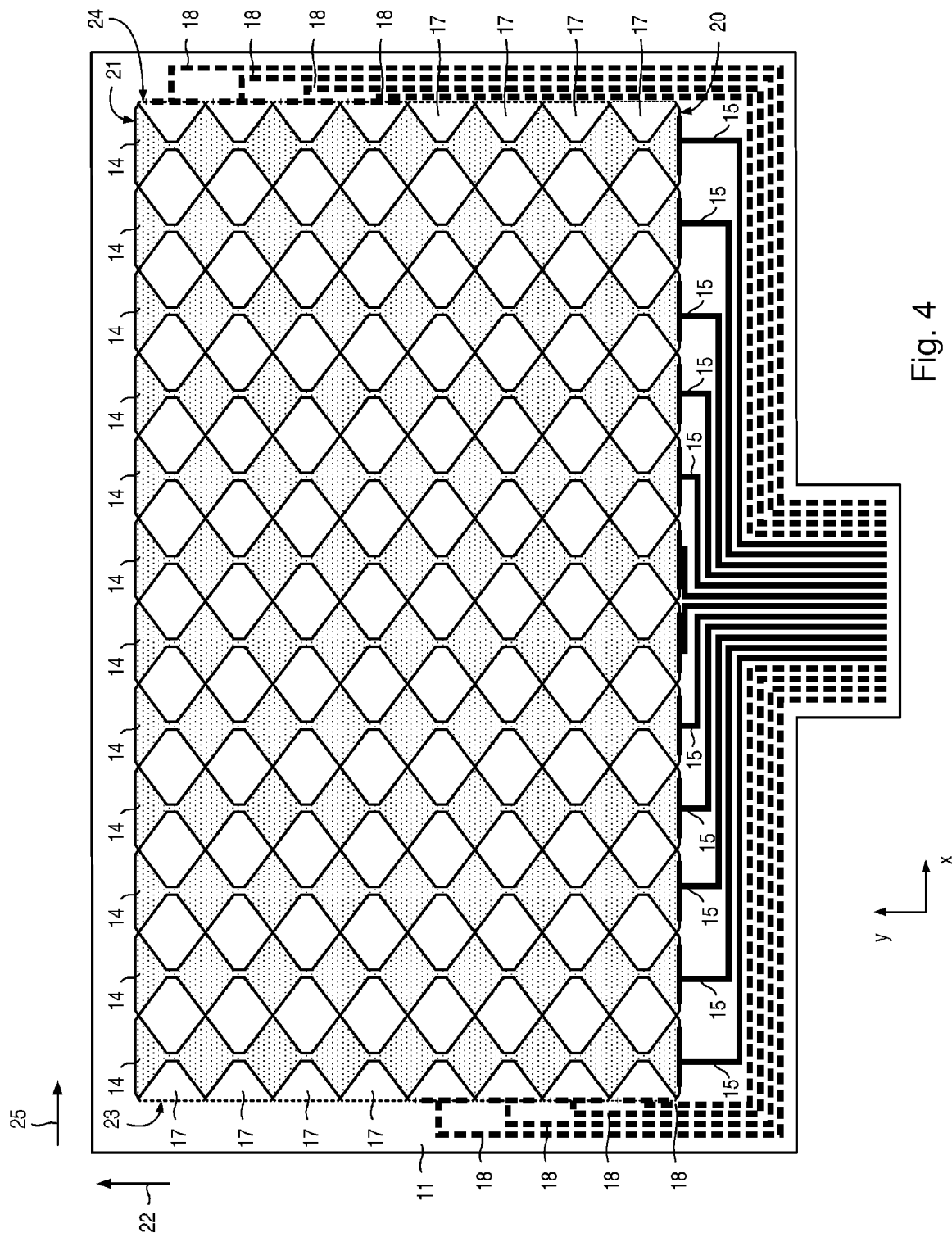
FIG. 4 is a plan view of the touch-sensitive input device shown in FIGS. 2 and 3 which includes first and second sets of electrodes on a substrate.

Referring to FIGS. 4, 5, 7 and 8, each of the first set of electrodes 14 extends between first and second edges 20, 21 (in FIG. 4 shown as bottom and top edges respectively of the set first set of electrodes 14) in a first direction 22 to form lines or strips. The electrodes 14 are arranged between third and fourth edges 23, 24 (in FIG. 4 shown as left-hand and right-hand edges of the second set of electrodes 17) in a second, perpendicular direction 25 to form an array of spaced-apart electrodes. In this example, the first set of electrodes 14 are arranged in a row (along the x-axis) as set of m columns (extending along the y-axis). In this example, m=12.

Figure 5:
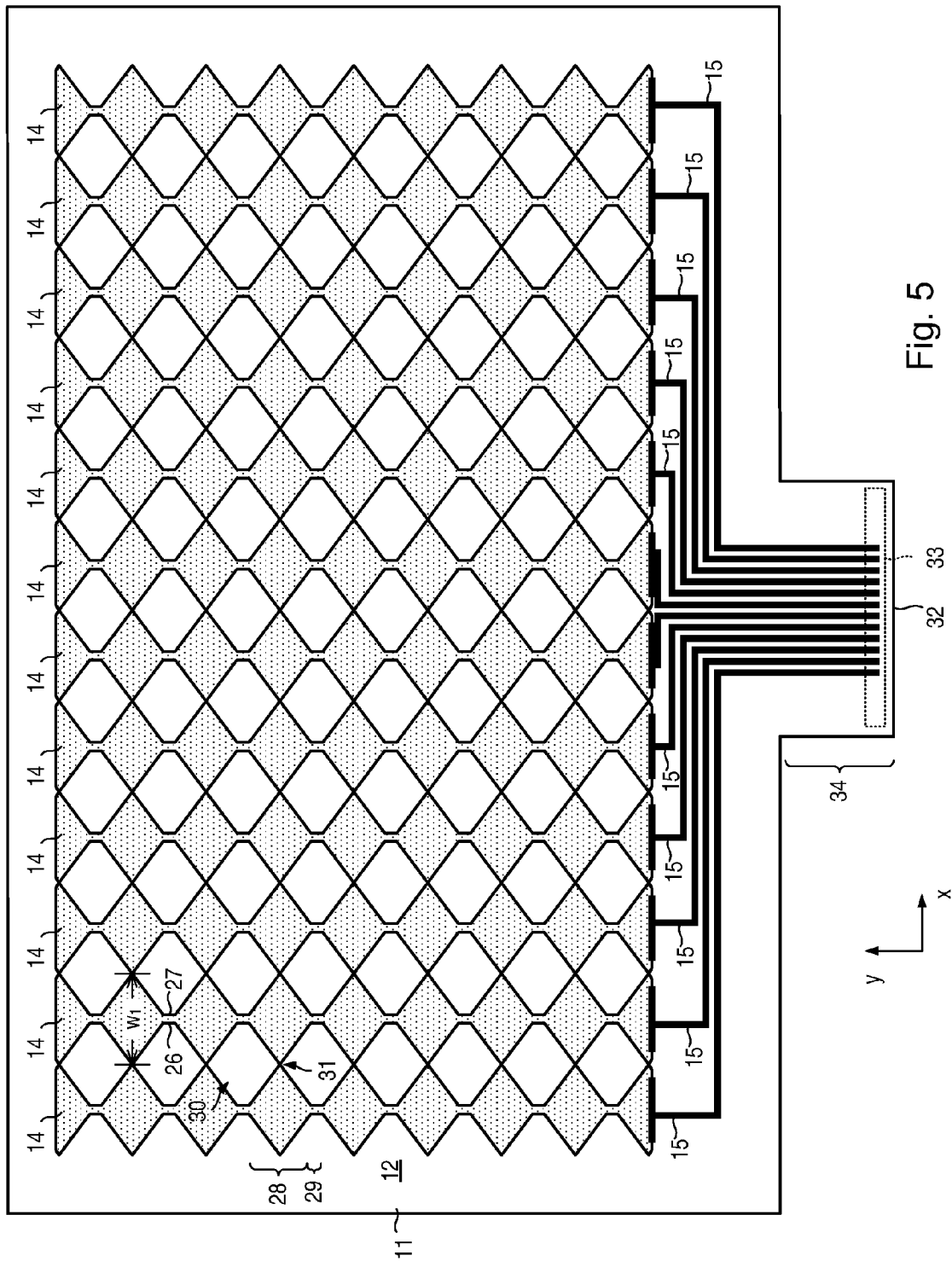
FIG. 5 is a plan view of the first set of electrodes shown in FIG. 4.

Referring in particular to FIG. 5, the width, $w_1$, of each electrode 14 between outer edges 26, 27 of an electrode 14 (in this example, left and right edges of an electrode) varies periodically. Each of the first set of electrodes 14 comprises a chain of wide and narrow sections 28, 29. In this case, the wide sections 28 are generally lozenge-shaped and the narrow sections 29 are generally rectangular. The wide sections 28 of adjacent electrodes 14 are aligned to form a string of narrow and wide inter-electrode spaces 30, 31. In this case, the wide spaces 31 are generally lozenge-shaped.

A set of conductive tracks 15 each, having a 'T'-shaped end, is connected to the ends the first set electrodes 14 along the first edge 21. Each conductive track 15 has a width, $w_t$, which may be, for example, between about 0.5 mm and 2 mm. Each conductive track 15 follows a path towards an edge 32 of the substrate 11. The conductive tracks 15 terminate in a region 33 at or close to (for example, within a few millimeters or centimeters) the edge 32 of the substrate 11. As shown in FIG. 5, the substrate 11 has a tab (or "tongue") region 34.

Referring to FIGS. 4, 6, 7 and 8, each of second set of electrodes 17 extends between third and fourth edges 23, 24 in the second direction 25 to form lines or strips. The electrodes 17 are arranged between first and second edges 20, 21 along the first direction 22 to form an array of spaced-apart electrodes. In this example, the second set of electrodes 17 are arranged in a column (along the y-axis) as set of n rows (extending along the x-axis). In this example, n=8.

The width, $w_2$, of each electrode 17 between outer edges 46, 47 (in this case, upper and lower edged) varies periodically. Each electrode 17 comprises a chain of wide and narrow sections 48, 49. In this case, the wide sections 48 are generally lozenge-shaped and the narrow sections 49 are generally rectangular. The narrow sections 49 are aligned to form a string of wide and narrow inter-electrode spaces 50, 51. In this case, the wide spaces 50 are generally lozenge-shaped (or "diamond-shaped").

The wide sections 48 of the second set of electrodes 17 are aligned with the wide spaces 30 between electrodes 14 in the first set of electrodes 14. Preferably, a wide section 48 of an electrode 17 fills a corresponding wide space 30 between electrodes 14 thereby maximising the areas of the electrodes 14, 17 and so variation in coupling when the user's finger touches or is brought close to the device 2.

When a finger, stylus or other pointer is placed on or close to the device 2, it bridges a pair of adjacent electrodes ($m_i$, $m_{i+1}$) in the first set of electrodes 14 and a pair of adjacent electrodes ($n_i$, $n_{i+1}$) in the second set of electrodes 17. The microcontroller 4 (or touch controller 3) detects the change in capacitance between the electrodes and, thus, can determine a set of x, y coordinates. In the case of the lozenge-shaped electrodes, the degree of coupling between electrodes varies with position between the electrodes. Therefore, a more accurate set of x, y coordinate can be determined.

A set of conductive tracks 18 each, having a 'T'-shaped end, is connected to the ends of the second set electrodes 17 along the third and fourth edges 23, 24. Each conductive track 28 has a width, $w_t$, which may be, for example, between about 0.5 mm and 2 mm. Each conductive track 28 follows a path towards the edge 32 of the substrate 11. The conductive tracks 18 terminate in the region 32 at or close to the edge of the substrate 11.

Figure 2:
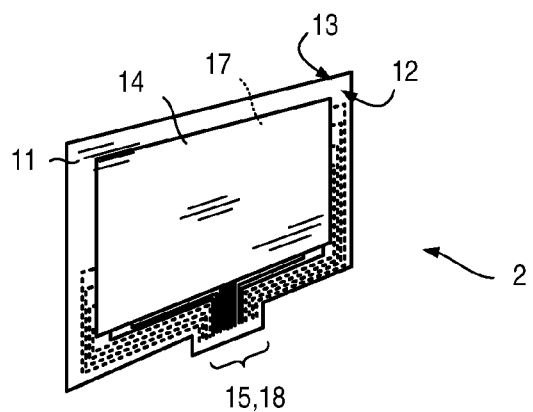
FIG. 2 is a perspective view of a touch-sensitive input device in accordance with the present invention.
Figure 3:
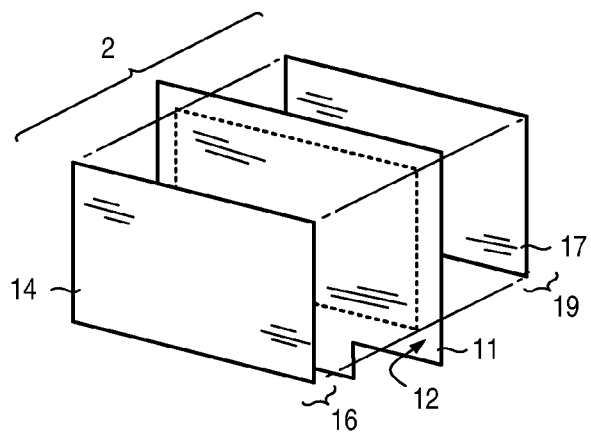
FIG. 3 is an exploded isometric view of the touch-sensitive input device shown in FIG. 2.

In the example shown in FIGS. 2, 3 and 4, the first and second sets of electrodes 14, 17 are formed on opposite faces 12, 13 of the substrate 11. This can make manufacture of the device 2 easier since the first and second sets of electrodes 14, 17 do not need to be accurately aligned.

Figure 9:
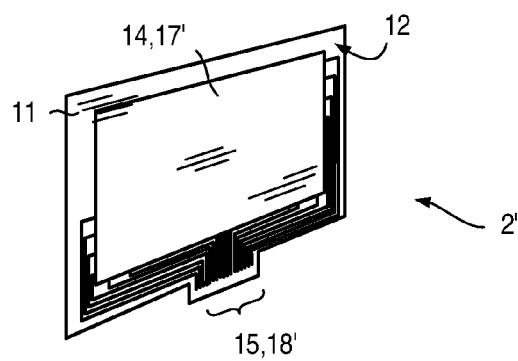
FIG. 9 is a perspective view of another touch-sensitive input device in accordance with the present invention.
Figure 10:
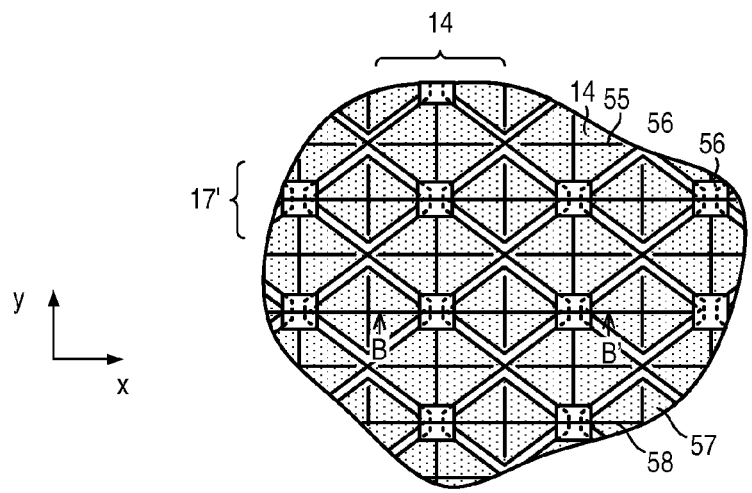
FIG. 10 is a magnified plan view of part of the touch-sensitive input device shown in FIG. 9.
Figure 11:
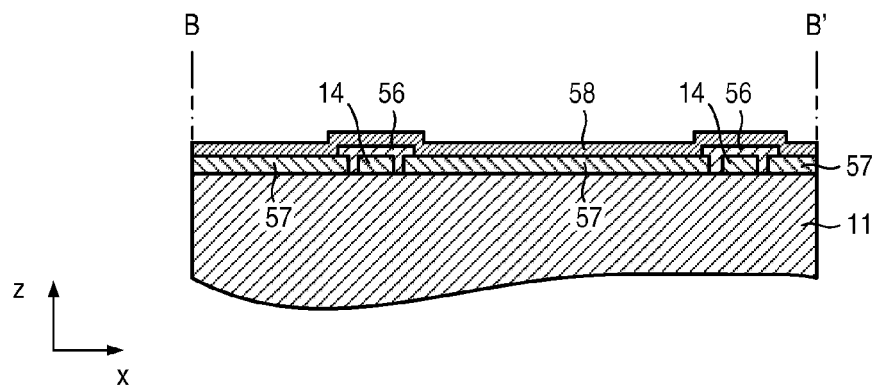
FIG. 11 is a cross-sectional view of the part of the touch-sensitive input device shown in FIG. 10 taken along the line B-B'.

Referring to FIGS. 9, 10 and 11, another device 2' is shown in which the first and second sets of electrodes 14, 17' can be formed on the same face 12.

Referring in particular to FIG. 10, the first set of electrodes 14 are similar to those in the device 2 shown in FIG. 4. However, instead of silver-based conductive ink, the electrodes in the first set of electrodes 14 mainly comprise carbon-based conductive ink. The electrodes 14 may have overlying crosses or frames 55. The frames 55 may comprise metal-based conductive ink, i.e. a material having a higher conductivity than the material of the underlying electrode.

Narrow regions 29 of the first set of electrodes 14 are covered by a pad 56 of insulating material, such as non-conductive ink.

A second set of electrode 17' comprise two portions 57, 58. The first portions 57 comprise patches of conductive material, such as carbon-based conductive ink. These patches 57 may be formed at the same time as the first set of electrodes 14, e.g. printed at the same time. The second portions 58 comprise elongate connecting lines (or "spines") and, optionally, shorter lines crossing the elongate lines. The elongate lines 58 run over the insulating pads 56 and onto adjacent patches 57 thereby connecting a string of patches 57 and forming an elongate electrode 17'.

In the example shown in FIGS. 9, 10 and 11, the first set of electrodes 14 and patches 57 of the second set of electrodes 17' can be formed (e.g. printed) at the same time and so be accurately aligned with respect to each other. This helps to avoid a short forming between the first and second set of electrode 14, 17'. The insulting pads 56 can be formed, e.g. printed, to form bridges over the first set of electrodes 14. The connecting lines 58 are formed, e.g. by printing, to electrically complete the second set of electrodes 17' and may also help to reduce line resistance. When forming the connecting lines 58 separate lines may be formed over the first set of electrodes 14 to also help reduce line resistance.

Figure 12:
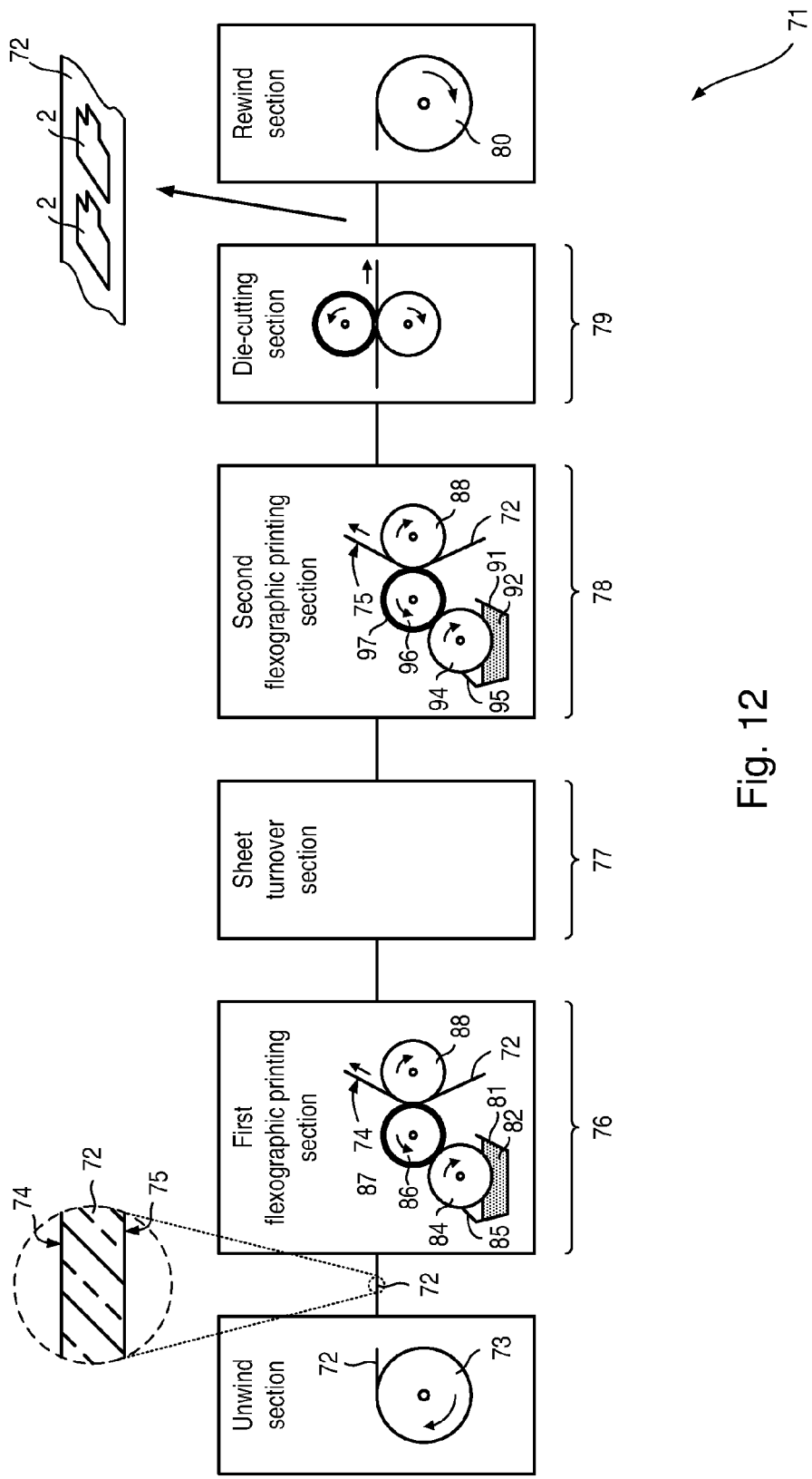
FIG. 12 is a schematic diagram of a moving continuous sheet process for fabricating the touch-sensitive input device.

Referring to FIG. 12, apparatus 71 (or a "press") for manufacturing the touch-sensitive input device 2 (FIG. 2) is shown.

As shown in FIG. 11, the press 71 is based on a moving continuous flow process.

A sheet (or "web") of opaque material 72 (such as paper or card or a laminate) is wrapped around an unwind roller 73. The sheet 72 has first and second surfaces 74, 75.

The sheet 72 is paid out from the unwind roller 73 and passes through a series of sections 76, 77, 78, 79 to produce an array of devices 2 which can be wound onto a take-up roller 80.

A first printing section 76 takes the form of a flexographic printing section which includes an ink pan 81 holding conductive ink 82, an anilox roll 84, a doctor blade 85 arranged to control the ink 82 on the anilox roll 84, a plate cylinder 86 having a plate 87 bearing an image of the first set of electrodes 14 and tracks 15 and an impression cylinder 88. The plate cylinder 86 is used to apply conductive ink 82 to the first surface 74 of the sheet 72.

The first printing section 76 includes a drying section (not shown) which may include hot air blowers (not shown) and/or lamps (not shown) to help dry or cure the conductive ink 82.

A section 77 may be included to turn over the sheet 72 so as to allow a second printing section 78 to print on the second surface 74 of the sheet 72. In some presses, the turnover section 77 may be incorporated into the first and/or section printing sections or may be omitted if the second printing section 78 is able to print on the second surface 74 of the sheet 72 without the need to turn the sheet 72 over.

A second printing section 78 takes the form of a flexographic printing section which includes an ink pan 91 holding conductive ink 92, an anilox roll 94, a doctor blade 95 arranged to control the ink 92, a plate cylinder 96 having a plate 97 bearing an image of the second set of electrodes 17 and tracks 18 and an impression cylinder 98. The plate cylinder 96 is used to apply the conductive ink 92 to the second surface 75 of the sheet 72.

The second printing section 78 includes a drying section (not shown) which may include hot air blowers and/or lamps to help dry or cure the conductive ink 92.

The first and/or second printing sections 76, 78 may include an additional inking roller (or "meter roller") which applies ink to the anilox roller. The doctor blade may be formed as part of blade unit.

A cutting section 78 may be included. The cutting section 78 may take the form of a rotary die cutting roller 101 and a counter impressing roller 102.

Additional stages can be included. For example, an additional flexographic printing stage can be included to print the insulating pads 56 (FIG. 10) comprising non-conductive ink. As will be explained later, moulding stages may also be included so as to mould the substrate.

As explained earlier, the device 2 may be fabricated using the press 71 shown in FIG. 12. However, other arrangements and other types of manufacturing process can be used. For example, other printing processes, such as ink jet or gravure printing, may be used. A sheet fed process can be used in which single planar sheets are processed. This type of process may be used if the sheet is sufficiently rigid.

In the examples described earlier, the sets of electrodes are provided on a two-dimensional, i.e. flat, substrate. However, the sets of electrodes may be provided on a moulded substrate.

Figure 13:
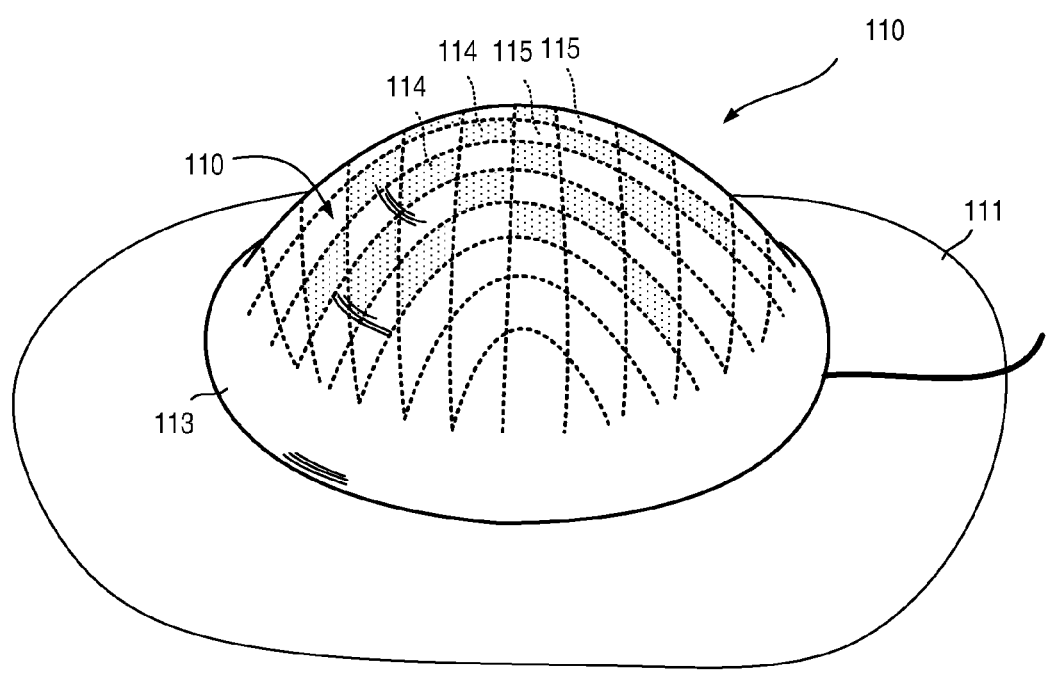
FIG. 13 illustrates a moulded article which includes a touch-sensitive input device.

FIG. 13 shows a pointing device 110 sitting on a surface 111 of, for example, as a desk or table. The device 110 has an outer surface 112 and is generally dome-shaped having a diameter of about 15 cm and a height of about 5 cm. However, the device 110 can be larger or smaller. The pointing device 110 can be used as a touch pad (similar to those found in laptop computers) and as a replacement for a track ball device. Thus, a user can comfortably run their finger(s) over the surface 112, for example, to move a pointer or focus (not shown) on a monitor.

The device 110 comprises a substrate 113 which supports first and second sets of electrodes 114, 115 formed of conductive ink. The substrate 113 comprises a formable paper or card, such as Billerud FibreForm®. In this case, the electrodes 114, 115 are provided on an inner surface (not shown) of the substrate 113 so as to protect the electrodes 114, 115. However, the electrodes 114, 115 may be provided on inner and outer surfaces and, for example, the outer surface may be covered by a protective layer (not shown) of paper or plastic, i.e. the device may be laminated. The protective layer (not shown) may support graphics or other printed indicia.

The device 110 is similar to the devices 2, 2' hereinbefore described and can be manufactured in a similar way. Thus, feature configuration and dimensions can be the same or similar to those described earlier. Additionally, the substrate 113 is moulded. Conductive ink regions (or foil regions) forming the electrodes 114, 115 and tracks (not shown) are sufficiently flexible to stretch without breaking.

Devices which are ordinarily made from plastic can be made from fibre-based material, such as paper, card and cardboard, to make fibre-based alternative. Not only can such devices be made more cheaply and easily (for example, avoiding expensive plastic extrusion or moulding), but also they can be more environmentally friendly.

Referring again to FIG. 12, the process may include printing conductive ink on only one side of the sheet 72 and device 2 may be formed by folding the sheet 72 so that the first and second sets of electrodes 14, 17 overlap. Thus, the turnover section 77 can be omitted.

Figure 14:
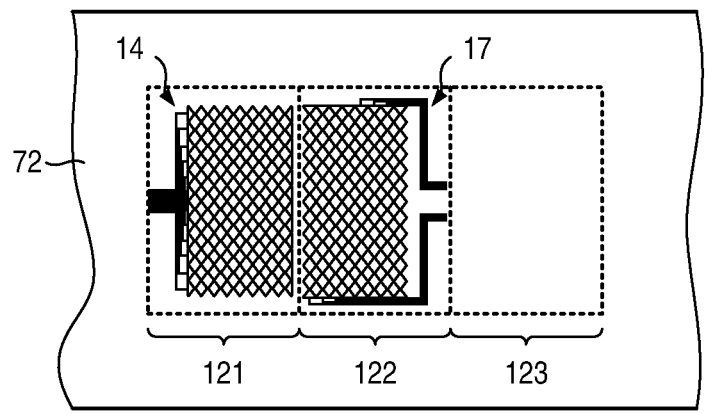
FIG. 14 shows a single-sided printing process.

Referring to FIG. 14, the first set of electrodes 14 are printed in a first area 121, the second set of electrodes 17 are printed in a second area 122 offset, for example, along the length of the sheet from the first area 122. A third area 123 may be provided which is free from conductive ink.

Figure 6:
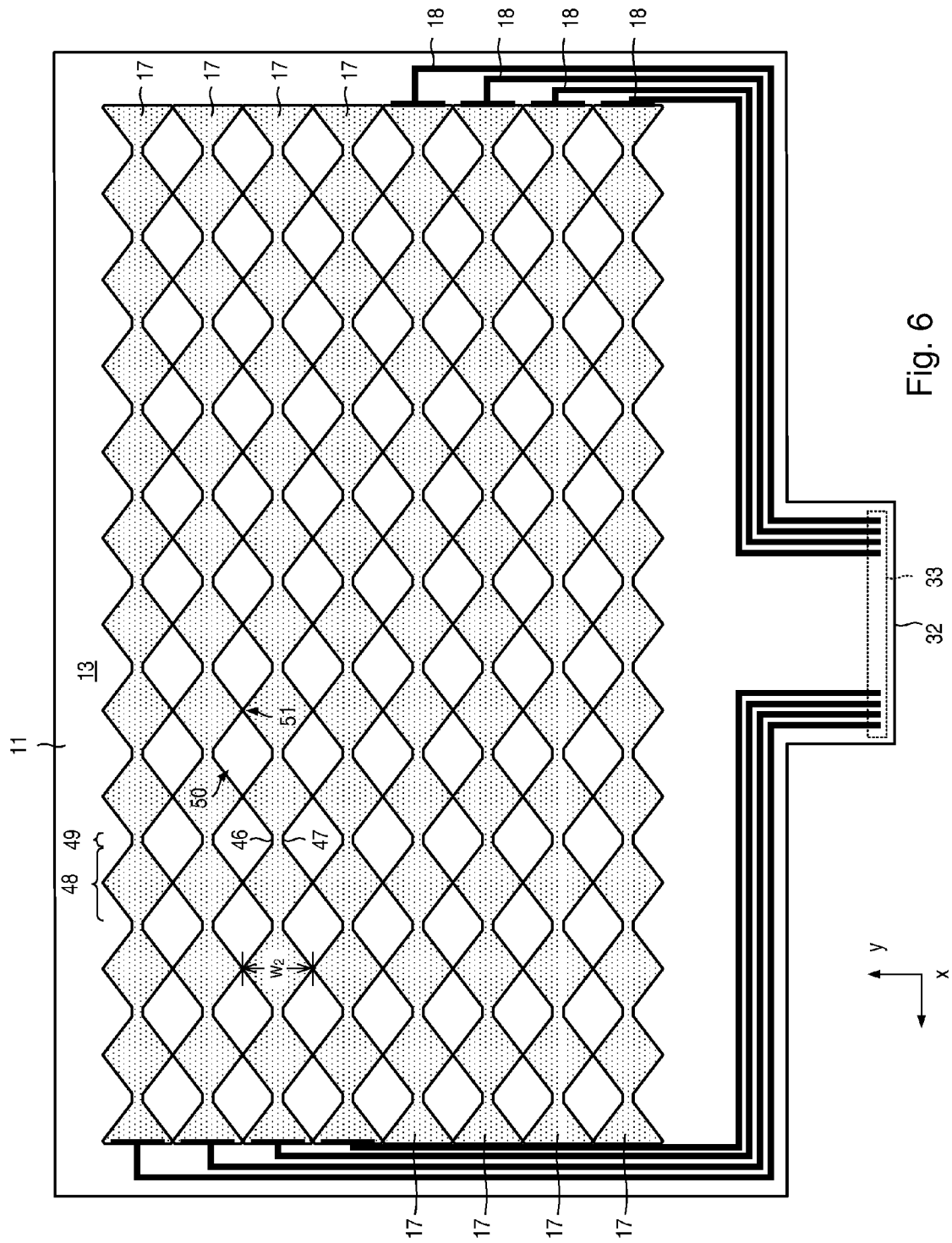
FIG. 6 is a plan view of the second set of electrodes shown in FIG. 4.
Figure 7:
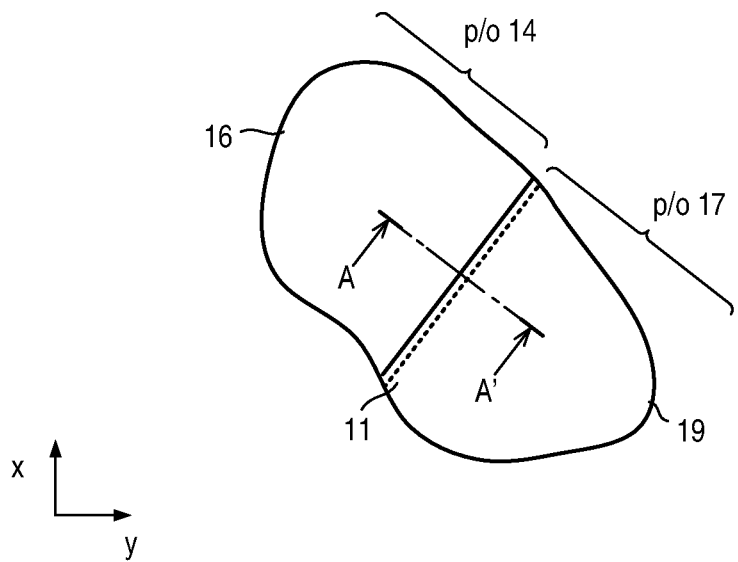
FIG. 7 is a magnified plan view of part of the touch-sensitive input device shown in FIG. 4.
Figure 8:
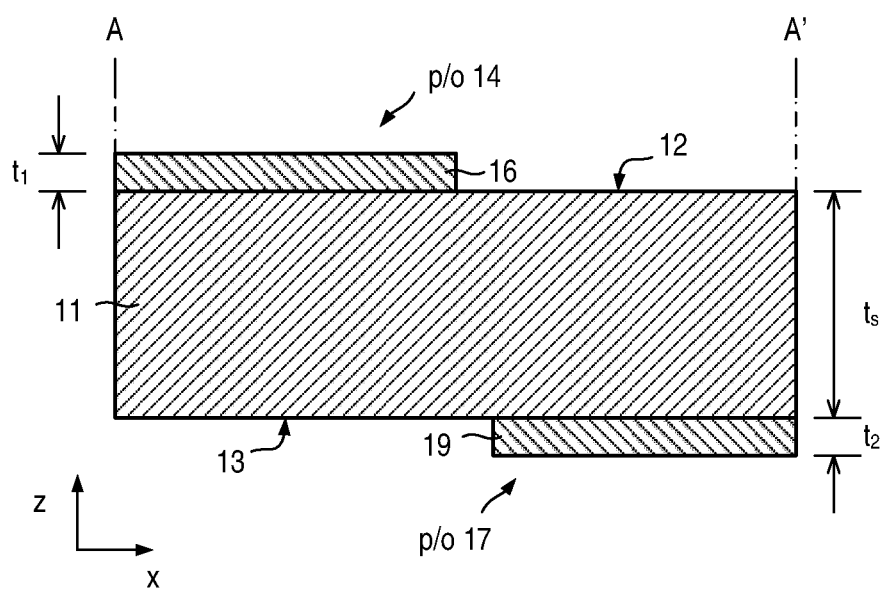
FIG. 8 is a cross-sectional view of the part of the touch-sensitive input device shown in FIG. 8 taken along the line A-A'.
Figure 15:
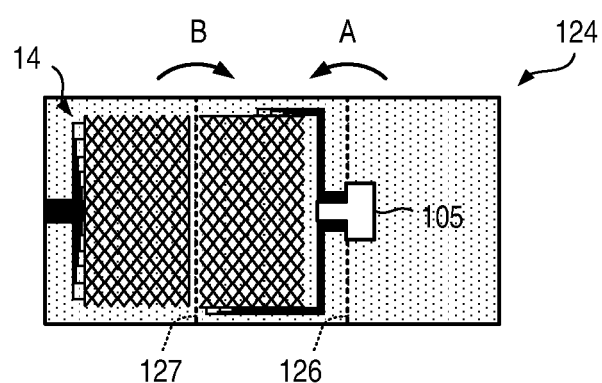
FIG. 15 illustrates construction of a touch-sensitive input device using two sets of electrodes printed on a single side of a sheet.

Referring also to FIG. 15, the sheet 72 may be cut to form a cut out 124 comprising the first and second areas 121, 122 and, optionally the third area 123. The cut out 104 can include aperture 125 (in this case, 'T' shaped) to allow connection to conductive tracks 15 (FIG. 5), 18 (FIG. 6).

The cut out 104 is folded along first and second crease lines 126, 127 so that the first and second sets of electrodes 14, 17 overlap. In this case, the electrodes 14, 17 face each other but are electrically isolated by the third area 123 of the cut out 124 which provides a separating insulating sheet. If the third area 123 is omitted, then a separate separating insulating sheet (not shown) may be provided.

The separating insulating sheet can be omitted. The cut out 104 can be folded so that the first and second sets of electrodes 14, 17 do not face each other, e.g. by being folded away from each other, or face in the same direction, e.g. by stacking.

The areas 121, 122, 123 need not lie in a line along the length of the sheet 72. For example, the first and second areas 121, 122 may be offset across the sheet. Furthermore, if there are three (or more) areas 121, 122, 123, the areas may tile in such a way to include bends, e.g. forming an 'L' shape.

This process can allow the touch-sensitive input device 2 to be made by printing on only one side of the sheet 72 and using simple cutting and converting processes to assemble the device 2, thereby making the device easier and cheaper to make.

It will be appreciated that many modifications may be made to the embodiments hereinbefore described.

For example, different numbers of electrodes can be used, i.e. different values of m and n can be used. For example, m may be lower or higher than 12 (e.g. 4, 8, 16, 32, 64, 128 or more) and/or n may be lower or higher than 8 (e.g. 4, 16, 32, 64, 128 or more).

The electrodes may be formed on separate substrates.

A set of electrodes and a corresponding set of conductive tracks may be made from different materials.

The electrodes and/or conductive tracks may comprise a metallic foil. For example, de-metallised film may be used wherein a layer of metal (such as aluminium) which coats a plastic film (such as PET) is partially removed (i.e. de-metallised) by masking and then etching to leave electrodes and tracks.

The touch-sensitive device may be touch switch.

The substrate may be transparent or translucent.

The substrate(s) may have other different outline shapes. For example, a substrate need not have straight edges, but can have curved edges. The substrates may include slots, slits, holes (which are relatively small compared to the size of a substrate) and/or apertures (which are relatively large compared to the size of a substrate).

The invention claimed is:

1. A method of fabricating a touch-sensitive input device, the method comprising:
   flexographically printing conductive ink to form a first set of electrodes on a first face of a first substrate, the first set of electrodes generally extending in a first direction and spaced apart along a second, transverse direction, wherein the first set of electrodes are opaque;
   flexographically printing conductive ink to form a second set of electrodes on a first face of a second substrate, the second set of electrodes generally extending in the second direction and spaced apart along the first direction, wherein the second set of electrodes are opaque; and
   overlapping the substrates such that the first and second sets of electrodes overlap,
   wherein:
      a width between outermost edges of each electrode in the first set of electrodes periodically increases and decreases along the electrode so as to form wide sections and narrow sections of the electrode, the first set of electrodes being arranged so as to form narrow and wide spaces between adjacent electrodes, and
      a width between outermost edges of each electrode in the second set of electrodes periodically increases and decreases along the electrode so as to form wide sections and narrow sections of the electrode, and wherein wide sections of each electrode in the second set of electrodes are disposed in wide spaces between adjacent electrodes in the first set of electrodes; and
      wherein the wide section of each electrode in the first set of electrodes has a maximum width of between 5 mm and 20 mm.

2. The method according to claim 1, wherein the wide sections are lozenge shaped.

3. The method according to claim 1, wherein the narrow section of each electrode in the first set of electrodes has a minimum width of between 1 mm and 5 mm.

4. The method according to claim 1, wherein the wide space between adjacent electrodes in the first set of electrodes has a maximum width of between 5 mm and 20 mm.

5. The method according to claim 1, wherein each electrode has a length of at least 100 mm.

6. The method according to claim 1, further comprising:
   flexographically printing conductive ink so as to form at least one conductive track, each conductive track running from or close to an edge of the substrate and being directly connected to a respective electrode, the at least one conductive track having a lower sheet resistance than the electrode.

7. The method according to claim 1, wherein the conductive ink comprises a metal-based conductive ink.

8. The method according to claim 1, wherein the conductive ink comprises a carbon-based conductive ink.

9. The method according to claim 1, wherein at least some of the electrodes comprise a metallic foil.

10. The method according to claim 1, wherein the electrodes in the first set of electrodes have a thickness of at least 8 µm, at least 10 µm, at least 12 µm or at least 15 µm.

11. The method according to claim 1, wherein the electrodes in the second set of electrodes have a thickness of at least 8 µm, at least 10 µm, at least 12 µm or at least 15 µm.

12. The method according to claim 1, wherein the first or second substrate is flexible.

13. The method according to claim 1, wherein the first or second substrate comprises a plastic material.

14. The method according to claim 1, wherein the first or second substrate is transparent.

15. The method according to claim 1, wherein the first or second substrate comprises a fibre-based material.

16. The method according to claim 15, wherein the fibre-based material comprises paper, card or cardboard.

17. The method according to claim 1, wherein the first or second substrate comprises a laminate.

18. The method according to claim 1, wherein the first or second substrate is moulded.

19. The method according to claim 1, further comprising: cutting a sheet to form the first and second substrates.

20. The method according claim 1, wherein portions of the method form a moving continuous flow process.

21. A touch-sensitive input device comprising:
   a first substrate having first and second opposite faces;
   a first set of electrodes comprising flexographically-printed conductive ink disposed on the first face of the first substrate, the electrodes generally extending in a first direction and spaced apart along a second, transverse direction, wherein the first set of electrodes are opaque;
   a second substrate having first and second opposite faces; and
   a second set of electrodes comprising flexographically-printed conductive ink disposed on the first face of the second substrate, the electrodes generally extending in the second direction and spaced apart along the first direction, wherein the second set of electrodes are opaque,
   wherein a width between outermost edges of each electrode in the first set of electrodes periodically increases and decreases along the electrode so as to form wide sections and narrow sections of the electrode, the first set of electrodes being arranged so as to form narrow and wide spaces between adjacent electrodes, and
   a width between outermost edges of each electrode in the second set of electrodes periodically increases and decreases along the electrode so as to form wide sections and narrow sections of the electrode, and wherein wide sections of each electrode in the second set of electrodes are disposed in wide spaces between adjacent electrodes in the first set of electrodes;
   wherein the wide section of each electrode in the first set of electrodes has a maximum width of between 5 mm and 20 mm;
   wherein the first and second substrates overlie, and
   wherein the first and second sets of electrodes overlap.

* * * * *